United States Patent
Huang et al.

(10) Patent No.: US 7,319,329 B2
(45) Date of Patent: Jan. 15, 2008

(54) COLD MASS WITH DISCRETE PATH SUBSTANTIALLY CONDUCTIVE COUPLER FOR SUPERCONDUCTING MAGNET AND CRYOGENIC COOLING CIRCUIT

(75) Inventors: Xianrui Huang, Clifton Park, NY (US); Paul Shadforth Thompson, Stephentown, NY (US); Evangelos Trifon Laskaris, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 102 days.

(21) Appl. No.: 11/164,520

(22) Filed: Nov. 28, 2005

(65) Prior Publication Data

US 2007/0120564 A1    May 31, 2007

(51) Int. Cl.
*G01V 3/00* (2006.01)
(52) U.S. Cl. ....................... 324/319; 324/320
(58) Field of Classification Search ............... 324/319, 324/320; 335/216, 296
See application file for complete search history.

(56) References Cited

U.S. PATENT DOCUMENTS

| | | | |
|---|---|---|---|
| 4,786,886 A * | 11/1988 | Tada et al. ................ 335/216 |
| 5,412,363 A * | 5/1995 | Breneman et al. .......... 335/216 |
| 5,917,393 A * | 6/1999 | Kupiszewski et al. ...... 335/216 |
| 6,783,059 B2 | 8/2004 | Laskaris et al. | |
| 7,053,740 B1 * | 5/2006 | Laskaris et al. ............ 335/216 |

FOREIGN PATENT DOCUMENTS

| | | |
|---|---|---|
| EP | 0413571 A1 | 8/1990 |
| EP | 0825706 A1 | 2/1998 |
| EP | 1533625 | 5/2005 |
| EP | 1744170 A1 | 1/2007 |
| GB | 1443207 A | 7/1976 |
| GB | 1443780 A | 7/1976 |
| GB | 2432725 | 11/2006 |
| JP | 61271804 A | 5/1985 |

OTHER PUBLICATIONS

M. Dupont et al., "3-D Metrology Applied to Superconducting Dipole Magnets for LHC," 8 pgs, no date.
H. Petersson et al., "Improvement of the Alignment Process of Superconducting Magnets and Low-β-Sections," pp. III/189-196, no date.
"Why a Hybrid Magnet System?" 5 pgs, no date.
Y. He et al., "Design and Operation of the Cryostat for the CESR-C Superconducting Wiggler Magnets," CBN 03-7, paper presented at PAC2003, Portland, Oregon, pp. 1-3, no date.
Definition of "cryostat" http://dictionary.reference.com/search?q=cryostat, 3 pgs. (Nov. 18, 2005).

(Continued)

*Primary Examiner*—Louis M. Arana
(74) *Attorney, Agent, or Firm*—Jean K. Testa; Curtis B. Brueske

(57) ABSTRACT

A cold mass for a superconducting magnet system in one example comprises a superconducting magnet, a cryogenic cooling circuit, and a magnet and cooling circuit support. The magnet and cooling circuit support comprises a substantially conductive coupler in a discrete path that serves to couple the superconducting magnet and the cryogenic cooling circuit.

15 Claims, 7 Drawing Sheets

OTHER PUBLICATIONS

M.A. Green et al., "The Mice Focusing Solenoids and Their Cooling System," University of Oxford Department of Physics, Oxford, UK, 4 pgs, no date.

"Tracker Solenoid Magnet," Section 4.5,(Nov. 28, 2005) 9 pgs.

"Superconducting Solenoid Magnets," Ch. 10, pp. 10-1 thru 10-31, no date.

Definition of "Eddy current" from *Wikipedia*, http://en.wikipedia.org/wiki/Eddy_current, 2 pgs. (Oct. 16, 2005).

Definition of "fiber" http://dictionary.reference.com/search?q=fiber, 3 pgs. (Nov. 6, 2005).

T. Pirling et al., "Ti6A14V Welded Components for Aerospace Technology: A Residual Stresses Study," ILL: Annual Report 2001, 3 pgs. (Nov. 19, 2005).

"Litz Wire" http://www.surplussales.com/Wire-Cable/LitzWire.html, 3 pgs. (Nov. 16, 2005).

"Litz Wire" MWS Wire Industries, http://www.mwswire.com/litzmain.htm, 1 pg. (Nov. 6, 2005).

Robert Nims, "Armor-Plated Auxiliary Power," *Mechanical Engineering*, 11 pgs., 1997, The American Society of Mechanical Engineers. (Nov. 16, 2005).

"The Basics of NMR," Ch. 7 NMR Hardware, http://www.cis.rit.edu/htbooks/nmr/chap-7/chap-7.htm, 7 pgs., 1997-99, J.P. Hornak. (Nov. 6, 2005).

"Superconducting Electric Power Applications," http://www.wtec.org/loyola/scpa/02_03.htm, 1997, WTEC Hyper-Librarian, 8 pgs. (Nov. 6, 2005).

Definition of "Superconducting Magnet" from *Wikipedia*, http://en.wikipedia.org/wiki/Superconducting_magnet, 2 pgs. (Nov. 6, 2005).

Search Report—Great Britain—Aug. 9, 2007.

* cited by examiner

COLD MASS WITH DISCRETE PATH SUBSTANTIALLY CONDUCTIVE COUPLER FOR SUPERCONDUCTING MAGNET AND CRYOGENIC COOLING CIRCUIT

BACKGROUND OF THE INVENTION

The invention relates generally to superconducting magnet systems and more particularly to superconducting magnets operating in an alternating current (AC) environment.

Exemplary superconducting magnet systems operating in an AC environment include a transformer, a generator, a motor, superconducting magnet energy storage (SMES), and a magnetic resonance (MR) system. Although a conventional MR magnet operates in a DC mode, some MR magnets may operate under an AC magnetic field from the gradient coils when the gradient leakage field to the magnet is high. Such an AC magnetic field generates AC losses in the magnet. An illustrative discussion of exemplary details of the MR system is presented, for explanatory purposes.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received nuclear magnetic resonance (NMR) signals are digitized and processed to reconstruct the image using one of many well known reconstruction techniques.

In one example of an MR system, a cold mass comprises a superconducting magnet, a magnet coil support structure, and a helium vessel. Liquid helium contained in the helium vessel provides cooling for the superconducting magnet and maintains the superconducting magnet at a low temperature for superconducting operations, as will be understood by those skilled in the art. The liquid helium maintains the superconducting magnet approximately and/or substantially at the liquid helium temperature of 4.2 Kelvin (K). For thermal isolation, the helium vessel that contains the liquid helium in one example comprises a pressure vessel inside a vacuum vessel.

The cold mass in one example comprises relatively large and/or extensive metal components. The helium vessel comprises relatively large pieces of stainless steel and/or aluminum. The magnet coil support structure comprises composite materials and/or relatively extensive distributions of metal.

When the superconducting magnet for the MR system operates in an AC field environment, eddy current is induced in the metal of the cold mass. Eddy currents are induced in a relatively large metal component of the helium vessel. In a further example, eddy currents are induced in a relatively extensive metal component of the magnet coil support structure.

The eddy currents generate heat. The heat generated by the eddy currents adds to the heat that needs to be dissipated for operation of the MR system. The eddy currents represent AC losses for the MR system, since the superconducting magnet needs to be maintained at the low temperature for the superconducting operations.

It would therefore be desirable to promote a reduction in presence and/or extent of metal available for eddy currents and resultant AC losses in a superconducting magnet system. To promote heat removal from the superconducting magnet, it would be desirable to promote liquid helium cooling flow and avoidance of helium vapor lock in a superconducting magnet system.

BRIEF DESCRIPTION OF THE INVENTION

In accordance with one aspect of the invention, a cold mass for a superconducting magnet system comprises a superconducting magnet, a cryogenic cooling circuit, and a magnet and cooling circuit support. The magnet and cooling circuit support comprises a substantially conductive coupler in a discrete path that serves to couple the superconducting magnet and the cryogenic cooling circuit.

In accordance with another aspect of the invention, an MR system of an MR apparatus comprises a plurality of gradient coils positioned about a bore of a magnet of a cold mass to impress a polarizing magnetic field and an RF transceiver system and an RF switch controlled by a pulse module to transmit RF signals to an RF coil assembly to acquire MR images. The cold mass of the MR system comprises a magnet and cooling circuit support that comprises a substantially conductive coupler in a discrete path that serves to couple the magnet and a cryogenic cooling circuit of the cold mass.

In accordance with a further aspect of the invention, metal associated with a magnet and cooling circuit support of a cold mass for a superconducting magnet system is limited to one or more discrete paths that couple a superconducting magnet and a cryogenic cooling circuit.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE PREFERRED EMBODIMENTS

Figure 1:
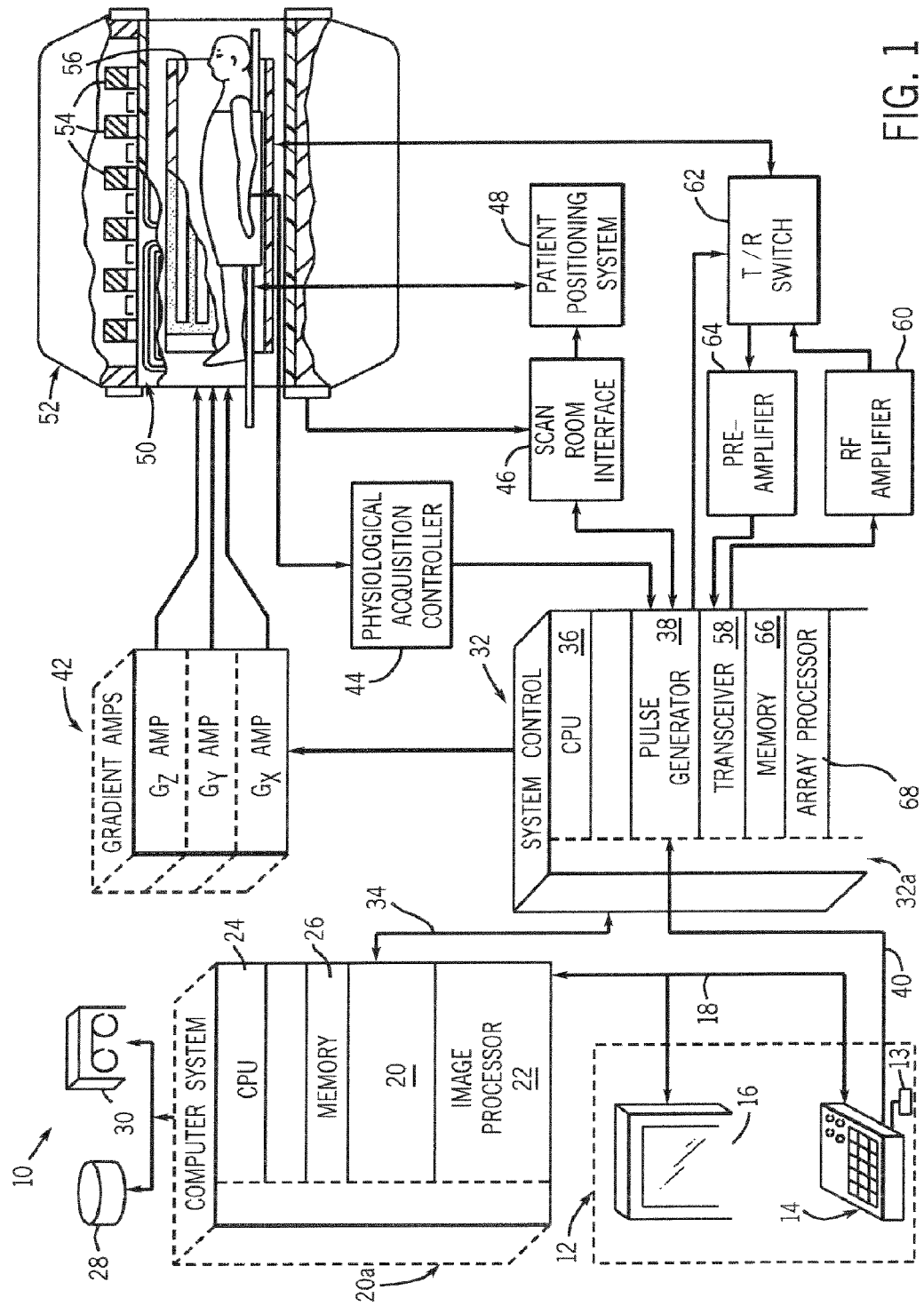
FIG. 1 is a schematic block diagram of a superconducting magnet system that in an example comprises an MR system.

Referring to FIG. 1, superconducting magnet system 10 in an example comprises a superconducting magnet systems operating in an alternating current (AC) environment. Exemplary superconducting magnet systems comprise a transformer, a generator, a motor, superconducting magnet energy storage (SMES), and/or a magnetic resonance (MR) system. Although a conventional MR magnet operates in a DC mode, some MR magnets may operate under an AC magnetic field from the gradient coils when the gradient leakage field to the magnet is high. Such an AC magnetic field generates AC losses in the magnet. An illustrative discussion of exemplary details of a magnetic resonance and/or magnetic resonance imaging (MRI) apparatus and/or system are presented, for explanatory purposes.

The operation of the MR system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the radio frequency (RF) pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
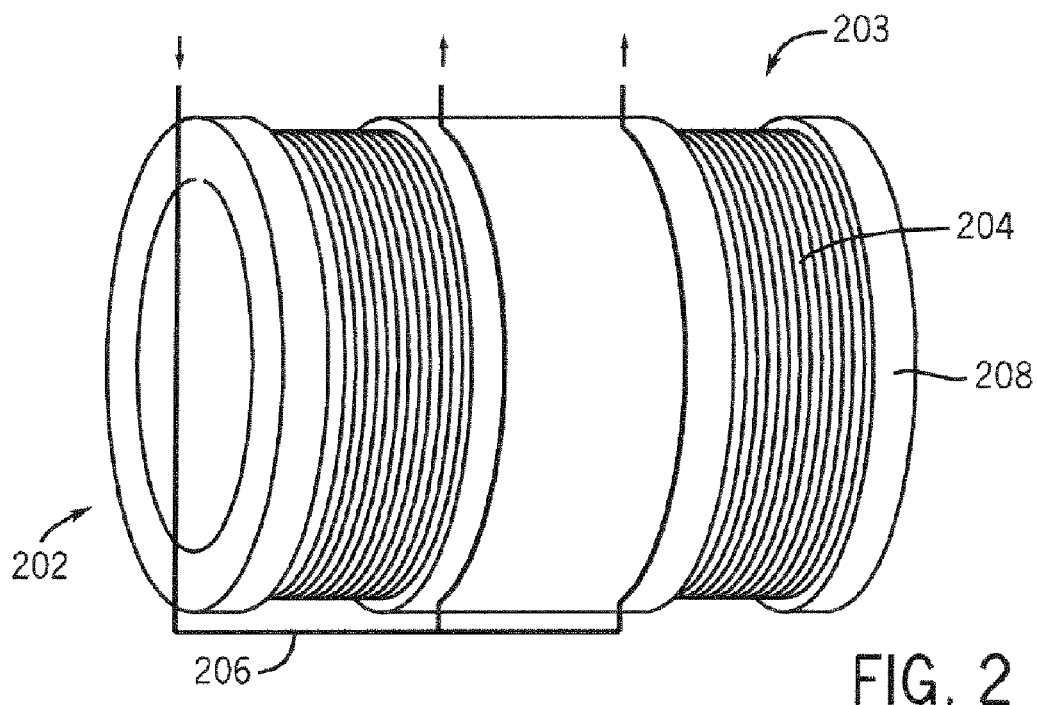
FIG. 2 is a representation of a side perspective view of an exemplary cold mass for a superconducting magnet system, illustrating an exemplary cooler for exemplary horizontal orientation of the cold mass.
Figure 7:
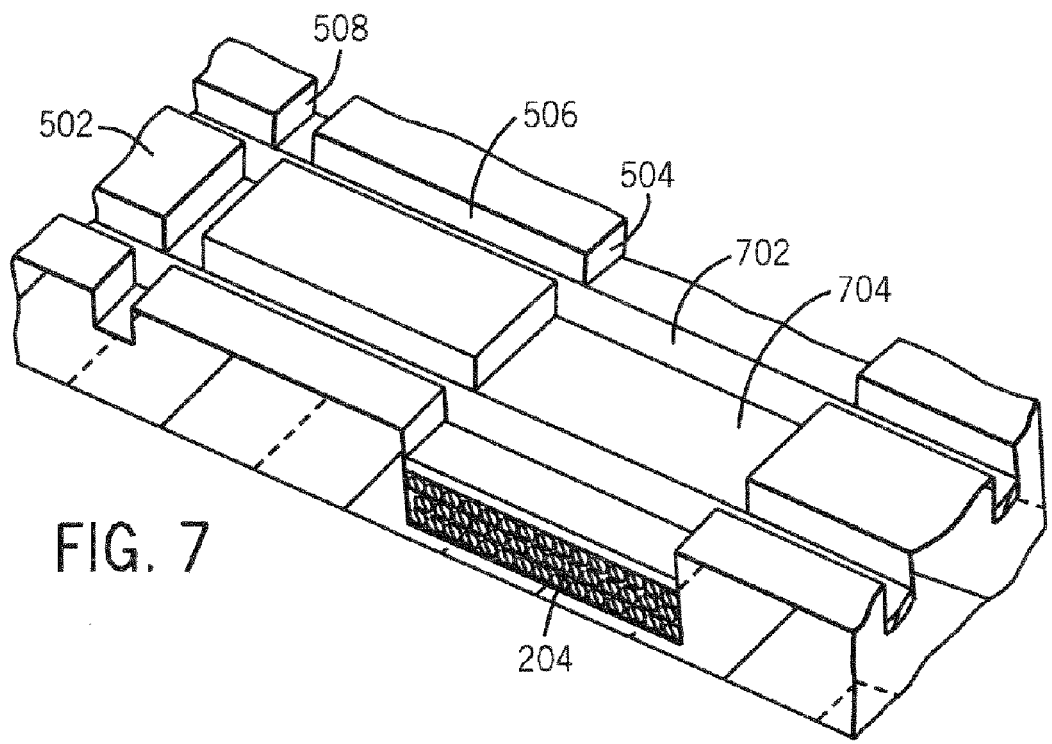
FIG. 7 is similar to FIG. 6 and further illustrates installation of exemplary conductive couplers of the support.

Referring to FIG. 2, the magnet assembly 52 (FIG. 1) comprises a cold mass 202 for the superconducting magnet system 10. The cold mass 202 comprises one or more superconducting magnets 203 that comprise one or more superconducting coils 204. The cold mass 202 comprises one or more cooling circuits 206. The cold mass 202 comprises one or more supports 208. The cold mass 202 comprises a superconducting magnet 203 that comprises a plurality of superconducting coils 204, a cooling circuit 206, and a support 208. The support 208 comprises a cylindrical shape. The support 208 comprises one or more substantially conductive couplers, for example, one or more conductive couplers 702 (FIG. 7). An exemplary conductive coupler 702 comprises a thermally conductive coupler located in a discrete path that serves to couple one or more of the superconducting coils 204 of the superconducting magnet 203 and the cooling circuit 206, as described herein.

FIG. 2 illustrates an exemplary cooling circuit 206 for exemplary horizontal orientation of the cold mass 202. The cold mass 202 comprises a substantially horizontal orientation that coordinates with and/or matches a substantially horizontal orientation of the magnet assembly 52, as illustrated in FIG. 1. The polarizing magnet 54 (FIG. 1) comprises the superconducting magnet 203 that comprises the superconducting coils 204. The superconducting coils 204 comprise one or more conductors wound on the support 208.

In one example, the superconducting coils 204 comprise one or more wires of a type 2 superconductor cable. For example, the superconducting coils 204 comprise niobium titanium (NbTi).

The superconducting coils 204 are bonded to the support 208. Epoxy serves to bond the superconducting coils 204 to the support 208. Bonding serves to keep the superconducting coils 204 and the cooling circuit 206 connected with the support 208, including the conductive couplers 702 and one or more spacers 704 (FIG. 7). Bonding serves to keep one or more portions of one or more of the superconducting coils 204 and/or the cooling circuit 206 connected with the support 208, including one or more of the conductive couplers 702 and/or the spacers 704. Epoxy serves to perform the bonding. For example, the superconducting coils 204 are wound and brushed with epoxy. In one example, the superconducting coils 204 are impregnated with epoxy. The conductive couplers 702 are laid on the superconducting coils 204 and the cooling circuit 206 with epoxy and cured to create physical bonds.

The cooling circuit 206 comprises a cryogenic cooling circuit. In a further example, the cooling circuit 206 comprises one or more cooling circuit sections. The cooling circuit 206 comprises an inlet path and an outlet path. The inlet path of the cooling circuit 206 comprises a substantially downward inlet path. The inlet path of the cooling circuit 206 avoids direct conductive thermal engagement with the conductive coupler 702. The outlet path of the cooling circuit 206 comprises a substantially upward outlet path. The outlet path of the cooling circuit 206 comprises direct conductive thermal engagement with the conductive coupler 702.

The inlet path of the cooling circuit 206 comprises an entrance that extends substantially downward from an upper portion of the support 208. The inlet path of the cooling circuit 206 serves to delay direct conductive thermal engagement of the cooling circuit 206 with the conductive coupler 702 and substantial thermal engagement with a heat load from the superconducting coil 204 until the outlet path of the cooling circuit 206. The outlet path of the cooling circuit 206 comprises direct conductive thermal engagement with the conductive coupler 702 and substantial thermal engagement with the heat load from the superconducting coil 204. In one example, the outlet path of the cooling circuit 206 comprises one or more curves that traverse the support 208 from a lower portion to the upper portion of the support 208 in an approximate and/or substantial half circle shape and terminate in one or more corresponding outlets that extend substantially upward.

The cooling circuit 206 comprises an approximate and/or substantial half circle shape to provide cooling. The cooling circuit 206 carries helium for cooling superconducting operations. The helium maintains the superconducting coils 204 approximately and/or substantially at the liquid helium temperature of 4.2 Kelvin (K). The cooling circuit 206 comprises tubes arranged to provide cooling. The outlet path of the cooling circuit 206 is at least in part embedded in the support 208. For example, the cooling circuit 206 comprises close-loop cooling tubes embedded in the support 208.

The outlet path of the cooling circuit 206 at least in part comprises a rectangular cross-section cooling tube that serves to promote a relatively large area for contact with the conductive coupler 702. A cooling tube cross-section of the cooling circuit 206 is rectangular to have a relatively large area for contact with the conductive coupler 702. In one example, the cooling circuit 206 comprises one or more of stainless steel, aluminum, copper, and/or ceramic. The cooling circuit 206 is helium-leak tight.

Where the cooling circuit 206 comprises metal in one example the metal is cut and an electrical isolator in inserted.

The electrical isolator in one example comprises an electrically insulating tube. For example, the electrical isolator comprises a ceramic isolator. The electrical isolator comprises one portion of a loop implementation of the cooling circuit 206. The electrical isolator serves to break eddy current in the cooling circuit 206 to reduce AC losses. The cooling circuit 206 comprises metal tubes with relatively thin walls to promote a reduction in AC losses from the constituent metal of the cooling circuit 206. The metal tubes of the cooling circuit 206 comprise a wall thickness of 0.010 inches to 0.020 inches (0.25 millimeters to 0.5 millimeters).

The upper portion of the cooling circuit 206 comprises a top of the cooling circuit 206. The lower portion of the cooling circuit 206 comprises a bottom of the cooling circuit 206. For example, the lower portion of the cooling circuit 206 comprises a bottom side of the cooling circuit 206. Liquid helium flows to the bottom of the cooling circuit 206 and helium gas bubbles flow up and exit from the top of the cooling circuit 206. The liquid helium in the outlet path of the cooling circuit 206 is thermally coupled directly with the conductive coupler 702 and therefore indirectly with the superconducting coils 204. By absorption of heat from the superconducting coils 204, the liquid helium is transformed into the helium gas bubbles.

The inlet path and the outlet path of the cooling circuit 206 are arranged to prevent vapor lock in the inlet path. Liquid helium in the cooling circuit 206 transforms into vapor helium under relatively high heat loads in the outlet path, where the vapor can bubble out without causing vapor lock. Liquid helium in the cooling circuit 206 avoids transformation into vapor helium and accumulation of vapor helium under high heat loads in the inlet path of the cooling circuit 206 by avoiding direct thermal coupling of the inlet path of the cooling circuit 206 with the conductive coupler 702.

The cooling circuit 206 illustrated in FIG. 2 comprises a vertically oriented entrance for the liquid helium that extends downward at a periphery of the top of the support 208 and along an end face of the support 208. The entrance of the cooling circuit 206 substantially, orthogonally connects with a substantially horizontal intermediate passage that extends substantially horizontally under the bottom side of the support 208 to extend substantially orthogonally, vertically upward to meet the bottom side of the support 208 at one or more curves of the cooling circuit 206. An exemplary curve of the cooling circuit 206 traverses the support 208 from the bottom side to the top in an approximate and/or substantial shape of a half circle. The curve terminates in an outlet of the cooling circuit 206 that extends substantially vertically upward from the top of the support 208.

The shape of the cooling circuit 206 illustrated in FIG. 2 promotes avoidance of vapor lock. The inlet path of the cooling circuit 206 from the entrance for the liquid helium that extends downward from the top of the support 208 until meeting the one or more curves of the cooling circuit 206 serves to delay direct conductive thermal engagement of the cooling circuit 206 with the heat load from the superconducting coils 204 of the superconducting magnet 203. In addition, the inlet path of the cooling circuit 206 until meeting the one or more curves postpones direct conductive thermal engagement of the cooling circuit 206 with the heat load from the superconducting coils 204 until a remaining path of the cooling circuit 206 extends substantially vertically upward through the one or more curves and corresponding one or more outlets. Absorption of heat by the helium that results in transformation from liquid helium into helium vapor which bubbles upward and away from the cold mass 202 through the cooling tubes of the cooling circuit 206. For example, absorption of heat by the helium that results in transformation from liquid helium into helium vapor will continue a thermal flow as the helium vapor bubbles upward and away from the cold mass 202 through the outlets from the curves of the cooling circuit 206. Vapor flow continues by ensuring helium gas will not accumulate at the top of the support 208 at the entrance of the cooling circuit 206, with nowhere to go.

Figure 3:
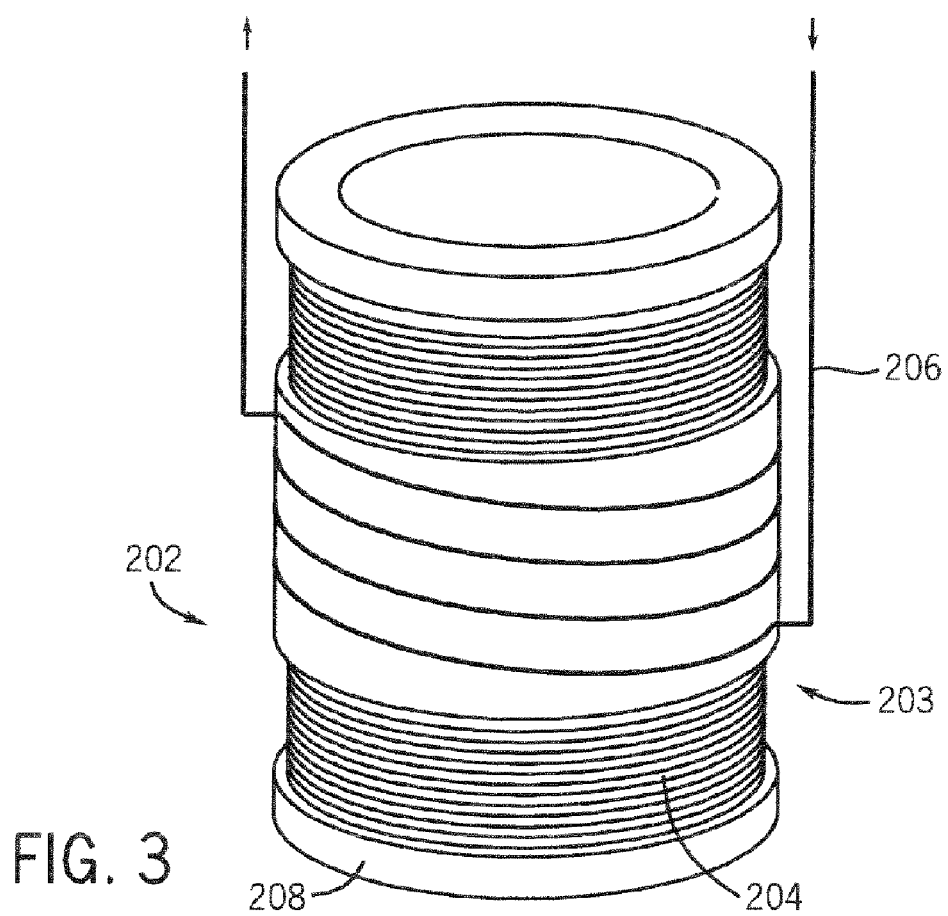
FIG. 3 is similar to FIG. 2 and illustrates an exemplary cooler for exemplary vertical orientation of the cold mass.

FIG. 3 illustrates an exemplary cooling circuit 206 for exemplary vertical orientation of the cold mass 202. The cold mass 202 comprises a substantially vertical orientation that coordinates with and/or matches a substantially vertical orientation of the magnet assembly 52 (FIG. 1), as will be appreciated by those skilled in the art. The cooling circuit 206 comprises an approximate and/or substantial spiral shape to provide cooling. The inlet path of the cooling circuit 206 comprises an entrance that extends substantially downward from an upper portion of the support 208. The outlet path of the cooling circuit 206 comprises a spiral that traverses the support 208 from a lower portion to the upper portion and terminates in an outlet that extends substantially upward. Liquid helium flows to the bottom of the cooling circuit 206 and helium gas bubbles flow up and exit from the top of the cooling circuit 206.

The inlet path of the cooling circuit 206 comprises a substantially straight, vertically oriented entrance for the liquid helium that extends vertically downward at the top of the support 208 and along a side of the support 208. The entrance of the cooling circuit 206 substantially, orthogonally connects with a substantially horizontal passage that extends substantially horizontally to a surface of the side of the support 208 to meet a spiral of the outlet of the cooling circuit 206. The spiral of the cooling circuit 206 winds vertically upward atop the support 208 to terminate in another substantially horizontal passage that extends substantially orthogonally outward from the side of the support 208. That passage terminates in an outlet of the cooling circuit 206 that extends substantially vertically upward.

The shape of the cooling circuit 206 illustrated in FIG. 3 promotes avoidance of vapor lock. The inlet path of the cooling circuit 206 from the entrance for the liquid helium that extends downward from the top of the support 208 until meeting the spiral of the outlet path of the cooling circuit 206 serves to delay direct conductive thermal engagement of the cooling circuit 206 with the heat load from the superconducting coils 204 of the superconducting magnet 203. In addition, the inlet path of the cooling circuit 208 until meeting the spiral of the outlet path postpones direct conductive thermal engagement of the cooling circuit 206 with the heat load from the superconducting coils 204 until a remaining path of the outlet of the cooling circuit 206 extends substantially vertically upward through the spiral and to the outlet. Absorption of heat by the helium that results in transformation from liquid helium into helium vapor which bubbles upward and away from the cold mass 202 through the cooling tubes of the cooling circuit 206. For example, absorption of heat by the helium that results in transformation from liquid helium into helium vapor will continue a thermal flow as the helium vapor bubbles upward and away from the cold mass 202 through the outlet from the spiral of the cooling circuit 206. Vapor flow continues by ensuring helium gas will not accumulate at the top of the support 208 at the entrance of the inlet path of the cooling circuit 206, with nowhere to go.

Referring to FIGS. 2 and 3, helium is channeled as liquid in the inlet path of the cooling circuit 206 of the cold mass 202 for the superconducting magnet system 10 to avoid direct conductive thermal engagement with the conductive coupler 702 that couples the cooling circuit 206 and the superconducting coil 204 of the cold mass 202. In a further example, the helium is channeled as liquid and/or vapor in the outlet path of the cooling circuit 206 with direct conductive thermal engagement with the conductive coupler 702. Vapor helium in one example may exist in the inlet of the cooling circuit 206 in insufficient quantity to cause vapor lock.

Figure 4:
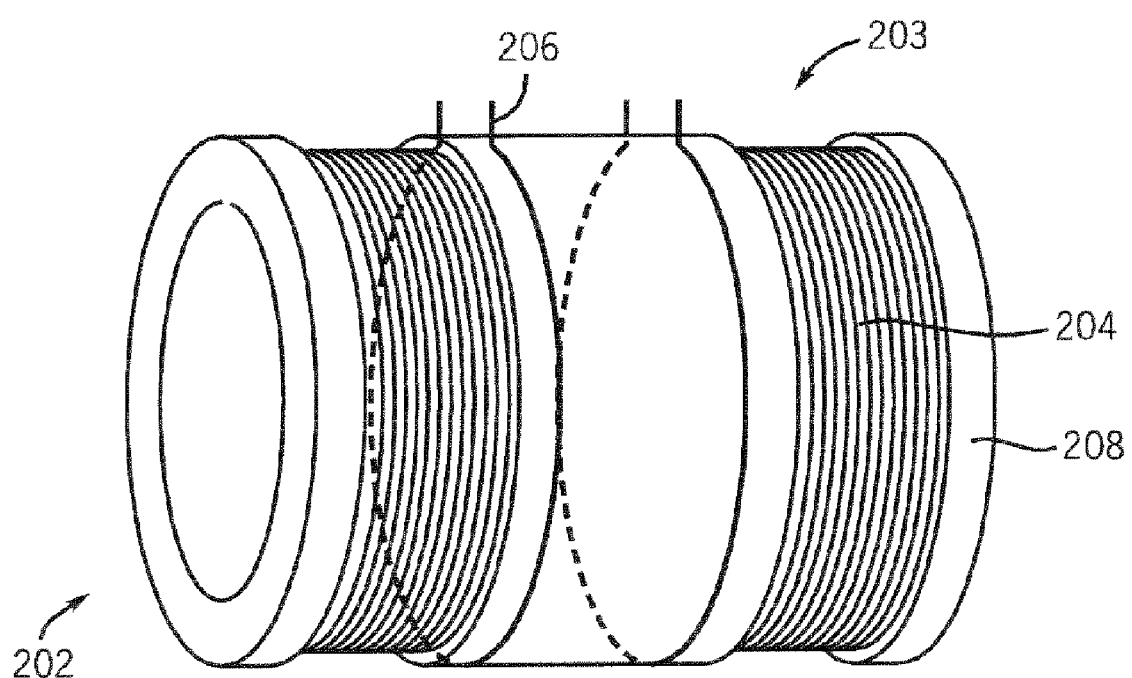
FIG. 4 similar to FIG. 2 and illustrates another exemplary cooler for exemplary horizontal orientation of the cold mass.

FIG. 4 illustrates another exemplary cooling circuit 206 for exemplary horizontal orientation of the cold mass 202. The cooling circuit 206 comprises an approximate and/or substantial full circle shape to provide cooling. In one example, several sets of cooling tubes of the cooling circuit 206 are clamped and epoxy bonded onto the support 208 at different axial locations.

Figure 5:
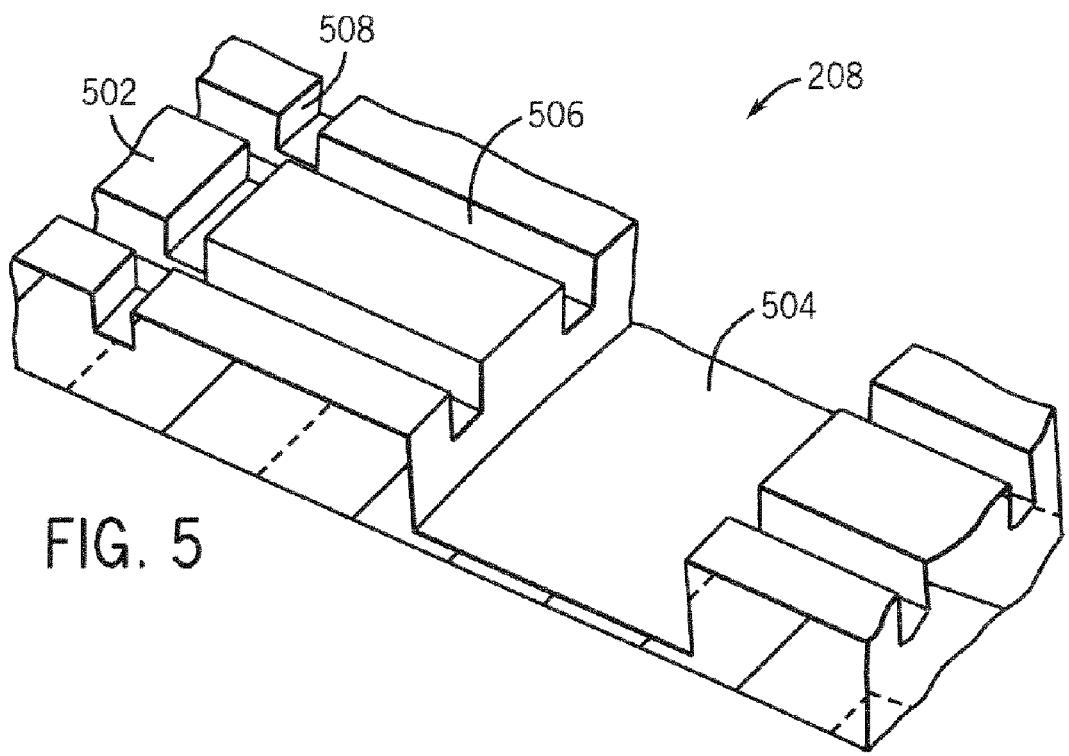
FIG. 5 is a representation of a top, partial, perspective, cutaway, enlarged view of an exemplary body of a support of the cold mass of FIG. 2.

Turning to FIG. 5, the support 208 of the cold mass 202 comprises a body 502. The body 502 comprises one or more coil passages 504, one or more coupler passages 506, and/or one or more cooling circuit passages 508. The body 502 comprises a relatively non-conducting structure to reduce presence of metal that would otherwise allow eddy currents that cause AC losses.

The support 208 comprises a plurality of layers and/or multiple layers. The multiple layers of the support 208 comprise one or more non-conductive layers and one or more discrete conductive layers, for example, that comprise one or more conductive couplers 702. The multiple layers of the support 208 comprise a plurality of non-conductive layers and one or more discrete conductive layers that comprise one or more conductive couplers 702. The multiple layers of the support 208 comprise a majority of non-conductive layers and minority of conductive layers, for example, that are discrete and comprise all and/or substantially all the conductive couplers 702 of the support 208. The minority of conductive layers comprises a plurality of the conductive couplers 702 in a plurality of discrete paths that serve to couple the superconducting magnet 203 and the cooling circuit 206. The minority of conductive layers comprises a plurality of the conductive couplers 702 in a plurality of discrete paths that serve to couple one or more superconducting coils 204 of the superconducting magnet 203 and the cooling circuit 206.

The body 502 of the support 208 in one example comprises a glass fiber composite or plastic. The glass fiber composite of the body 502 is machined, molded, or cast to form the coil passages 504, the coupler passages 506, and/or the cooling circuit passages 508. One or more of the coil passages 504, the coupler passages 506, and/or the cooling circuit passages 508 comprise grooves in the body 502.

Relative to the support 208, the coil passages 504 extend in a hoop direction, the coupler passages 506 extend in an axial direction, and/or the cooling circuit passages 508 extend in the hoop direction. The coupler passages 506 are located at an intermediate height of the body 502 in a radial direction relative to the support 208. In one example, the coupler passages 506 are located at half the total depth of the coil passages 504 in the radial direction relative to the support 208.

Figure 6:
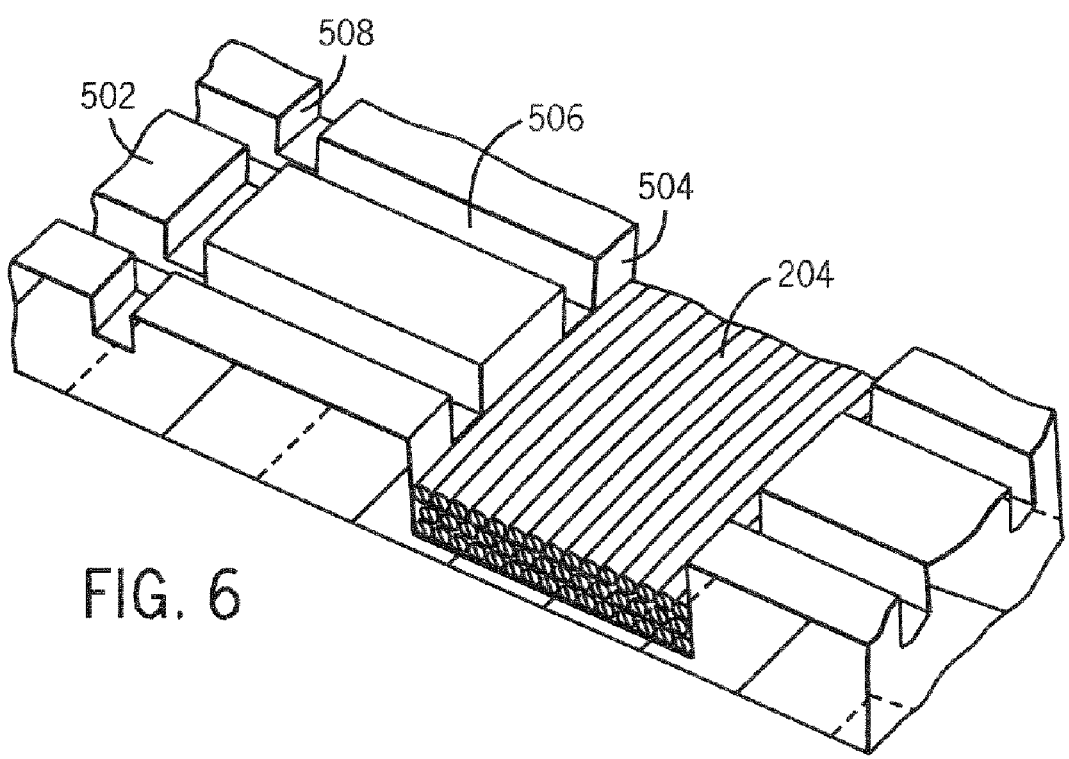
FIG. 6 is similar to FIG. 5 and further illustrates partial winding of an exemplary superconducting magnet coil on the body of the support.

Turning to FIG. 6, the superconducting coil 204 is located in the coil passage 504. The superconducting coil 204 is installed in the coil passage 504 by winding of superconducting wire. For example, the wire of the superconducting coil 204 is wound with twenty to forty turns per layer side by side. Successive layers of the conductor of the superconducting coil 204 are placed atop completed layers. The conductor turns and the conductor layers of the superconducting coil 204 are mutually bonded by epoxy. The superconducting coil 204 is partially wound in the coil passage 504 to an intermediate depth, for example, a halfway position.

Turning to FIG. 7, the conductive couplers 702 are located in the coupler passages 506. One or more of the spacers 704 are located between the conductive couplers 702. The conductive couplers 702 comprise a conducting metal. In one example, one or more of the conductive couplers comprise copper. In a further example, one or more of the conductive couplers comprise aluminum.

The conductive couplers 702 comprise fine-stranded, fully transposed conductors. An exemplary conductive coupler 702 comprises Litz wire and/or cable. An exemplary conductive coupler 702 is relatively thin, for example, 1/8 inch by 3/8 inch (3 millimeters by 10 millimeters).

A plurality of the conductive couplers 702 is employed if the superconducting coil 204 is relatively thick in the radial direction of the support 208. The number of conductive couplers 702 can vary depending upon the heat loads from and the thickness of the superconducting coils 204. The conductive couplers 702 comprise a substantially conductive layer that is employed if the superconducting coil 204 is relatively thick in the radial direction of the support 208. The number of conductive couplers 702 in the substantially conductive layer can vary depending upon the heat loads from and the thickness of the superconducting coils 204. The conductive couplers 702 comprise a plurality of substantially conductive layers that are employed if the superconducting coil 204 is relatively thick in the radial direction of the support 208. The number of substantially conductive layers of the conductive couplers 702 can vary depending upon the heat loads from and the thickness of the superconducting coils 204.

An exemplary spacer 704 comprises an approximately and/or substantially same thickness of the conductive coupler 702 relative to the radial direction of the support 208. The spacer 704 serves to fill space between the conductive couplers 702. The conductive coupler 702 and the spacer 704 are located in a same layer of the support 208.

In one example, the spacer 704 comprises a substantially non-conductive material. In another example, the spacer 704 comprises a substantially conductive material. The spacer 704 and the conductive coupler 702 comprise a substantially same material. Employment of a substantially conductive material for the spacer 704 serves to promote axial thermal conductance from the superconducting coil 204 to the cooling circuit 206 in the axial direction of the support 208.

The conductive coupler 702 comprises wires that are insulated electrically from each other. For example, the conductive coupler 702 comprises wires constructed of individually film insulated wires bunched or braided together in a substantially uniform pattern of twists and lay-lengths. A multi-strand configuration of the conductive coupler 702 serves to reduce power losses otherwise encountered in a solid conductor due to a skin effect or tendency of radio frequency current to be concentrated at the surface of the conductive couplers 702. To counteract this effect, the amount of surface area for conductive couplers 702 in one example is increased without appreciably increasing the size of the conductive couplers 702. Each individual strand in the Litz construction of the conductive couplers 702 is positioned in a substantially uniform pattern moving from the center to the outside and back in a given length. Efficiency of conductive couplers 702 can be enhanced by varying the number of twists per unit of length of the conductive couplers 702. The conductive coupler 702 comprises copper fibers in braids that are electrically insulated and twisted as a Litz wire cable to produce minimal alternating current (AC) losses when exposed to an AC field. The copper braids in the conductive coupler 702 comprise Litz wire cables of insulated copper fibers to produce relatively small AC losses when exposed to an AC field.

The conductive coupler 702 provides good thermal conductivity in the axial direction of the support 208. Litz wire used for the conductive conductor 702 will not electrically short upon cutting to be installed in the coupler passage 506 because the constituent wires are fully transposed. The AC field in one example will not be able to generate net current because the wires of the conductive coupler 702 are fully transposed. All the fibers of the conductive coupler 702 comprise a substantially equal or same electromagnetic coupling as with any other fiber. An exemplary conductive coupler 702 comprises an electrically insulated, fully transposed set of wires that serves to promote a reduction in AC losses. The electrically insulated, fully transposed set of wires serves to limit the AC loss within the conductive coupler 702.

In the coupler passages 506, the conductive couplers 702 run across superconducting coil 204, for example, at an intermediate position of winding of the superconducting coil 204 in the coil passage 504. The conductive coupler 702 is located in a discrete path that serves to couple the superconducting coil 204 in the coil passage 504 and a section of the cooling circuit 206 in the cooling circuit passage 508.

Figure 12:
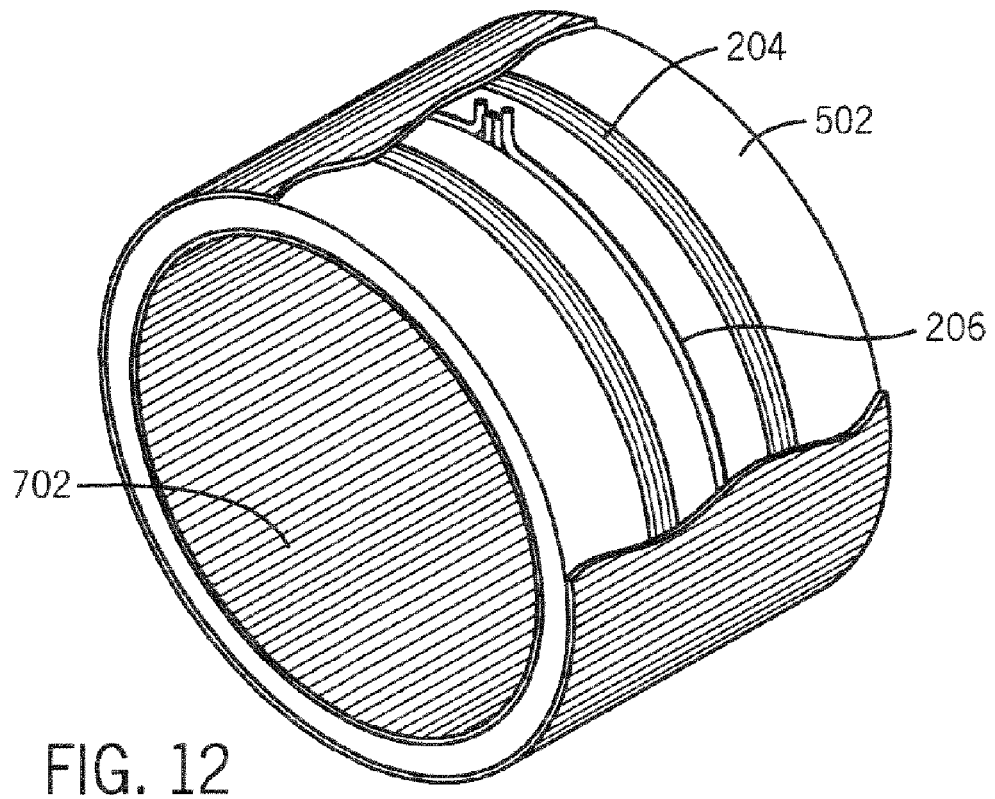
FIG. 12 is similar to FIG. 11 and further illustrates installation of an exemplary superconducting magnet and another exemplary conductive coupler layer on the body of the support.

In one example, the conductive coupler 702 is located at an intermediate position of a cylindrical wall of the support 208. In a further example, the conductive coupler 702 is located at a surface of the support 208. A plurality of the conductive couplers 702 is located at a corresponding plurality of surfaces of the support 208. One or more conductive couplers 702 are located at intermediate positions of the cylindrical wall of the support 208 and/or one or more conductive couplers 702 are located at corresponding surfaces of the support 208. FIG. 12 illustrates an exemplary cold mass 202 with inner and outer layers of the support 208 that comprise respective conductive layers of the conductive couplers 702. The cooling provided by the conductive layers of the conductive couplers 702 at the inner and outer layers of the support 208 are good for stability of the superconducting coil 204 because the superconducting coil 204 comprises relatively higher local magnet fields on the inner and outer diameters of the coil winding than in the middle of the coil winding of the superconducting coil 204.

Figure 8:
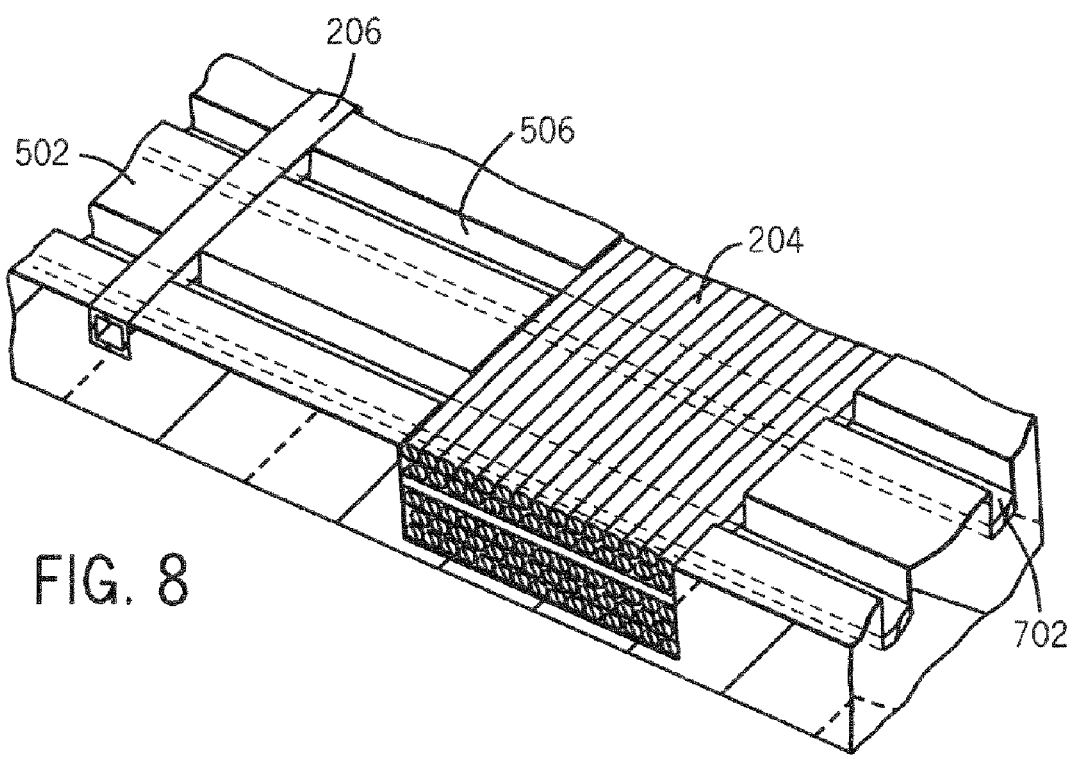
FIG. 8 is similar to FIG. 7 and further illustrates complete winding of the superconducting magnet coil and installation of an exemplary cooling circuit section on the support.

Turning to FIG. 8, the superconducting coil 204 is completely wound in the coil passage 504 and an exemplary section of the cooling circuit 206 is installed in the cooling circuit passage 508. The superconducting coil 204 and the section of the cooling circuit 206 are placed in good contact with the conductive couplers 702. The body 502 of the support 208, the superconducting coil 204, and the section of the cooling circuit 206 are interconnected by epoxy impregnation, for example, to promote conduction of heat away from the superconducting coil 204 to the section of the cooling circuit 206.

An exemplary conductive coupler 702 comprises a discrete path that serves to couple the superconducting coil 204 and the cooling circuit 206. In a further example, the conductive coupler comprises a substantially direct path between the superconducting coil 204 and the cooling circuit 206. The conductive coupler 702 is aligned substantially along the axial direction of the support 208. Where the superconducting coil 204 is located in the coil passage 504 oriented radially with respect to the support 208 and the section of the cooling circuit 206 is located in the cooling circuit passage 508 oriented radially with respect to the support 208, then the axial orientation of the conductive coupler 702 in the passage 506 comprises a most direct and/or shortest path between the superconducting coil 204 and the cooling circuit 206.

The conductive couplers 702 comprise metal and are associated with the support 208 for the superconducting coils 204 of the superconducting magnet 203 and the cooling circuit 206. For example, the support 208 comprises the conductive couplers 702. The metal of the conductive couplers 702 is limited to one or more discrete paths that couple the superconducting coils 204 and the cooling circuit 206.

The discrete paths of the conductive couplers 702 are aligned along the axial direction of the support 208.

The cold mass 202 comprises the superconducting magnet 203. The cold mass 202 comprises a plurality of the superconducting coils 204 that form the superconducting magnet 203. The conductive coupler 702 serves to couple the superconducting magnet 203 and the cooling circuit 206. The conductive coupler 702 serves to couple the superconducting coils 204 of the superconducting magnet 203 and the cooling circuit 206. The conductive coupler 702 in the coupler passage 506 thermally engages the superconducting coils 204 located in corresponding coil passages 504 and one or more sections of the cooling circuit 206 located in corresponding cooling circuit passages 508 of the body 502. A discrete path of the conductive coupler 702 in the coupler passage 506 serves to couple the superconducting coils 204 located in the corresponding coil passages 504 and the sections of the cooling circuit 206 located in the corresponding cooling circuit passages 508 of the body 502.

The support 208 comprises a plurality of the conductive couplers 702 located in a plurality of discrete paths that serve to couple the superconducting coil 204 and the cooling circuit 206. The support 208 comprises a first conductive coupler 702 located in a discrete path that serves to couple a first superconducting coil 204 and the cooling circuit 206 and a second conductive coupler 702 located in a discrete path that serves to couple a second superconducting coil 204 and the cooling circuit 206. The support 208 comprises a first conductive coupler 702 located in a discrete path that serves to couple a first superconducting coil 204 and a first section of the cooling circuit 206 and a second conductive coupler 702 located in a discrete path that serves to couple a second superconducting coil 204 and a second section of the cooling circuit 206.

Figure 9:
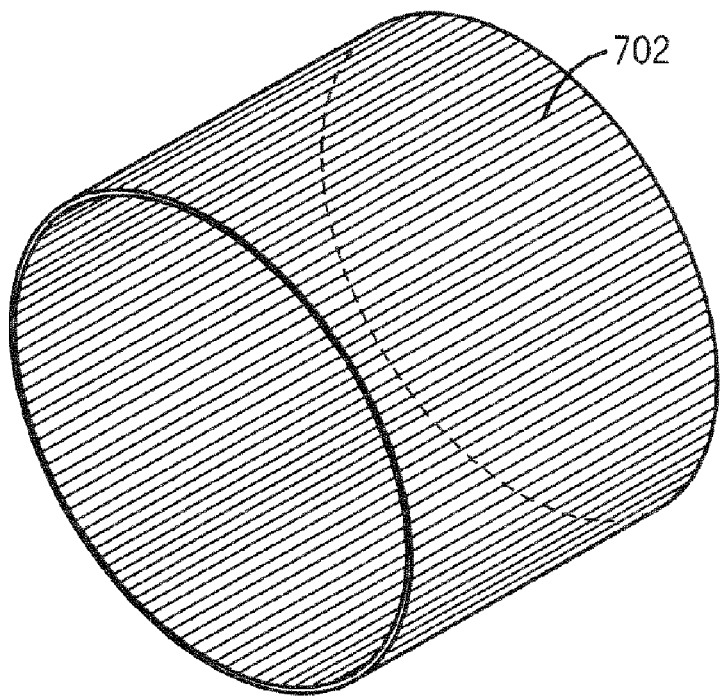
FIG. 9 is a representation of a perspective, partially in phantom view of an exemplary conductive coupler layer for a surface of a support of an exemplary cold mass for a superconducting magnet system.

Turning to FIG. 9, the conductive couplers 702 comprise a conductive layer. The conductive couplers 702 are epoxy bonded to form the conductive layer for a surface of the support 208 of the cold mass 202. The conductive couplers 702 are infused with epoxy to form an axially conductive cylinder. The conductive couplers 702 in the conductive layer comprise a cylindrical inner sleeve at an inner diameter of the cylindrical shape of the support 208.

The conductive couplers 702 in the conductive layer in one example comprise Litz wire flattened to provide high conductivity in the axial direction. The cables of the conductive couplers 702 comprise electrically insulated fine copper filaments, for example, Gauge 30, 36, or 40 to provide conduction with limited AC losses on the copper filament itself. For a conductive layer of the conductive couplers 702, the Litz wire cables are infused with epoxy to form an axially conductive cylinder.

Figure 10:
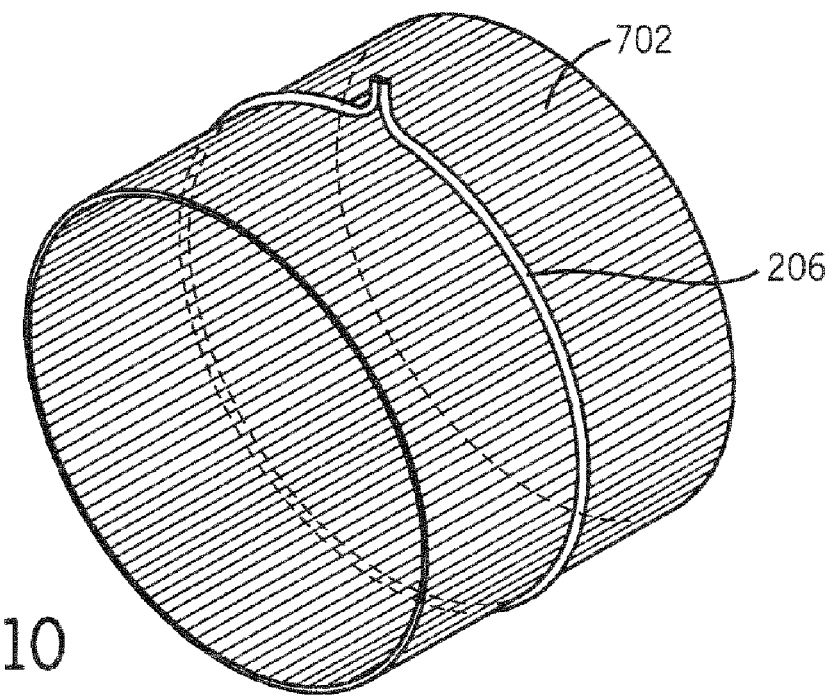
FIG. 10 is similar to FIG. 9 and further illustrates installation of an exemplary cooling circuit section on the conductive coupler layer.

Turning to FIG. 10, a section of the cooling circuit 206 is connected with the conductive layer of the conductive couplers 702. For example, stainless steel cooling tubes of the cooling circuit 206 are clamped and epoxy bonded to a Litz wire conductive cylinder of the conductive couplers 702.

Figure 11:
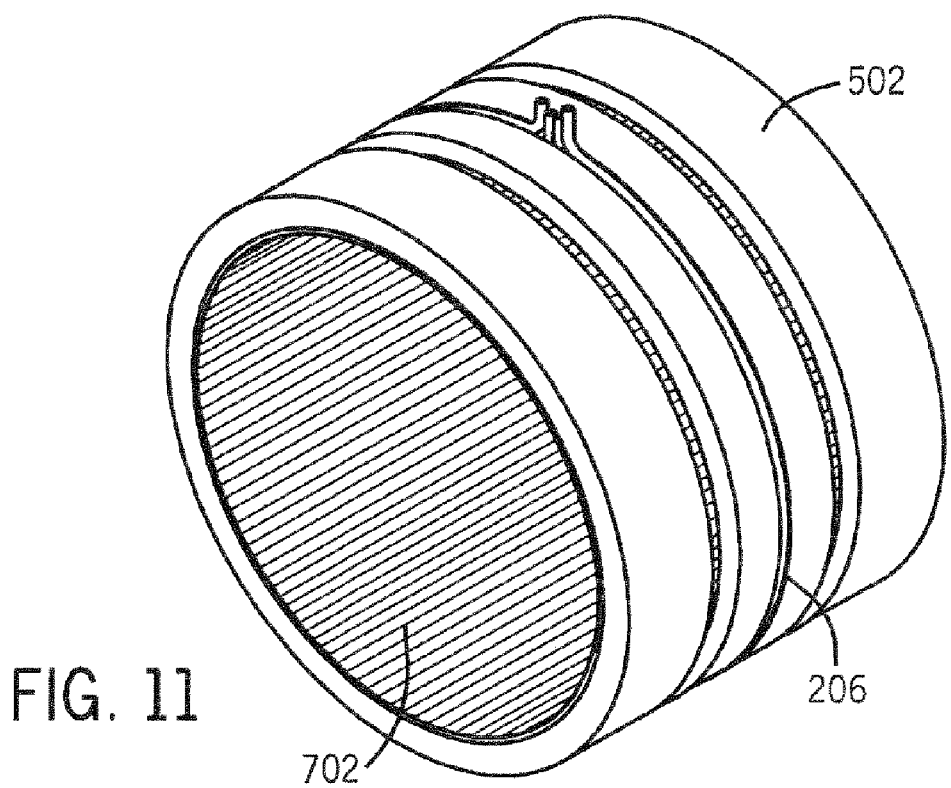
FIG. 11 is similar to FIG. 10 and further illustrates installation of a body of the support of the cold mass and another exemplary cooling circuit section.

Turning to FIG. 11, the body 502 of the support 208 is installed on the conductive layer of the conductive couplers 702 and another section of the cooling circuit 206 is installed in the cooling circuit passage 508. For example, glass fiber composite cylinders of the body 502 are clamped and epoxy bonded to the Litz wire cylinder of the conductive couplers 702 at the inner diameter of the support 208. The support 208 comprises a coil winding form and coil support structure with thermal interconnection. A set of cooling tubes of the cooling circuit 206 are clamped onto a surface at the outer diameter of the body 502.

The body 502 comprises precision pre-formed glass fiber rings that comprise grooves for the coil passages 504 and the cooling circuit passages 508 and a radial hole to allow the ends of the section of the cooling circuit 206 at the inner diameter of the cylindrical support 208 to stick through to the outer diameter of the cylindrical support 208. The glass fiber rings of the body 502 are wrapped around the conductive layer of the conductive couplers 702 that comprise the inner surface at the inner diameter of the support 208 without interference with space already occupied by the section of the cooling circuit 206 on the cooling tubes on the conductive layer of the conductive couplers 702 at the inner diameter of the support 208. The coil passage 504 in the body 502 allow the superconducting coil 204 to wrap all the way down from the section of the cooling circuit 206 and the conductive couplers 702 at the inner diameter of the support 208 for thermal bonding. The superconducting coil 204 wraps in the coil passage 504 all the way up to the outer diameter of the support 208 that comprises another layer of the conductive couplers 702 that is coupled with another section of the cooling circuit 206 for thermal bonding.

Turning to FIG. 12, the superconducting coils 204 are installed in the coil passages 504 and another exemplary conductive coupler layer of the conductive couplers 702 is installed on the body 502 of the support 208. The superconducting coils 204 are wound onto the body 502 and epoxy bonded to a Litz wire cable cylinder of the conductive couplers 702 that comprise an inner surface of the cold mass 202. For an outer surface of the cold mass 202, Litz wire cables are axially laid across the outer diameter of the superconducting coils 204 and the body 502 to form a thermal pathway between the outer diameter of the superconducting coils 204 and an outer diameter of the cooling circuit section at the outer diameter of the body 502.

The conductive couplers 702 comprise metal that is limited to one or more discrete paths in one or more discrete layers that couple the superconducting magnet 203 and the cooling circuit 206. The conductive couplers 702 comprise metal that is limited to one or more discrete paths in one or more discrete layers that couple the superconducting coils 204 of the superconducting magnet 203 and the cooling circuit 206. The discrete paths and the discrete layers of the conductive couplers 702 are aligned along the axial direction of the support 208. A plurality of discrete paths of the conductive couplers 702 are located in the same layer of the support 208 and serve to couple the superconducting magnet 203 and the cooling circuit 206. A plurality of discrete paths of the conductive couplers 702 are located in the same layer of the support 208 and serve to couple the superconducting coils 204 of the superconducting magnet 203 and the cooling circuit 206.

One or more implementations of the cold mass 202 in one example comprise any implementation of the cooling circuit 206. An implementation of the cold mass 202 illustrated in FIG. 2 employs one or more implementations of the cooling circuits 206 illustrated in FIGS. 2, 3, and/or 4. An implementation of the cold mass 202 illustrated in FIG. 3 employs one or more implementations of the cooling circuits 206 illustrated in FIGS. 2, 3, and/or 4. An implementation of the cold mass 202 illustrated in FIG. 12 employs one or more implementations of the cooling circuits 206 illustrated in FIGS. 2, 3, and/or 4.

One or more implementations of the cold mass 202 in one example comprise any (e.g., horizontal, oblique, or vertical) orientation. One or more implementations of the superconducting magnet system 10 and/or one or more components of the superconducting magnet system 10, for example, one or more of the magnet assembly 52 and/or the cold mass 202 in an example comprise any (e.g., horizontal, oblique, or vertical) orientation, with the description and figures herein illustrating one or more exemplary orientations of one or more implementations, for explanatory purposes.

An implementation of the superconducting magnet system 10 in an example comprises a plurality of components such as one or more of electronic components, hardware components, and/or computer software components. A number of such components can be combined or divided in an implementation of the superconducting magnet system 10.

The present invention has been described in terms of the preferred embodiments, and it is recognized that equivalents, alternatives, and modifications, aside from those expressly stated, are possible and within the scope of the appending claims.

What is claimed is:

1. A cold mass for a superconducting magnet system, the cold mass comprising:
    a support comprising a body including a coil passage, a coupler passage, a cooling circuit passage and a conductive coupler made of a thermally conductive material;
    a superconducting magnet having a superconducting coil, a portion of the superconducting coil being disposed in the coil passage of the support; and
    a cryogenic cooling circuit, a portion of the cryogenic cooling circuit being disposed in the cooling circuit passage of the support,
    wherein the conductive coupler is in thermal contact with both the superconducting coil and the cryogenic cooling circuit to provide cryogenic cooling to the superconducting coil.

2. The cold mass of claim 1, wherein the coupler passage provides a substantially direct path between the superconducting coil and the cryogenic cooling circuit.

3. The cold mass of claim 1, wherein the body of the support further comprises a second coupler passage and a second conductive coupler, a portion of the second conductive coupler being disposed in the second coupler passage, and wherein the superconducting magnet further comprises a second superconducting coil in thermal contact with the second conductive coupler, and wherein the second conductive coupler is in thermal contact with both the second superconducting coil and the cryogenic cooling circuit to provide cryogenic cooling to the second superconducting coil.

4. The cold mass of claim 1, wherein the conductive coupler is aligned substantially along an axial direction of the support.

5. The cold mass of claim 1, wherein the conductive coupler is located at an intermediate position of a cylindrical wall of the support.

6. The cold mass of claim 1, wherein the conductive coupler is located at a surface of the support.

7. The cold mass of claim 1,
    wherein the body of the support further comprises a second conductive coupler in thermal contact with both the superconducting coil and the cryogenic cooling circuit to provide cryogenic cooling to the superconducting coil.

8. The cold mass of claim 1, wherein the superconducting coil further comprises a second superconducting coil, and wherein the cryogenic cooling circuit further comprises a second cooling circuit section,
    and wherein the body of the support further comprises a second conductive coupler in thermal contact with both the second superconducting coil and the second cooling circuit section to provide cryogenic cooling to the second superconducting coil.

9. The cold mass of claim 1, wherein the conductive coupler comprises an electrically insulated, fully transposed set of wires that serves to limit alternating current (AC) loss within the conductive coupler.

10. The cold mass of claim 1, wherein the body of the support comprises a plurality of layers, and wherein the conductive coupler comprises one layer of the plurality of layers.

11. An MR apparatus, comprising:
    an MR system that comprises a plurality of gradient coils positioned about a bore of a magnet of a cold mass to impress a polarizing magnetic field and an RF transceiver system and an RF switch controlled by a pulse module to transmit RF signals to an RF coil assembly to acquire MR images;
    wherein the cold mass of the MR system comprises a support including a body having a coil passage, a coupler passage, a cooling circuit passage and a conductive coupler made of a thermally conductive material; a superconducting magnet having a superconducting coil, a portion of the superconducting coil being disposed in the coil passage of the support; and a cryogenic cooling circuit, a portion of the cryogenic cooling circuit being disposed in the cooling circuit passage of the support, wherein the conductive coupler is in thermal contact with both the superconducting coil and the cryogenic cooling circuit to provide cryogenic cooling to the superconducting coil.

12. The MR apparatus of claim 11, wherein the support comprises a plurality of layers, and wherein the conductive coupler comprises one layer of the plurality of layers that is aligned substantially along an axial direction of the support.

13. A process, comprising the step of:
    limiting metal associated with a support of a cold mass for a superconducting magnet system to conductive coupler made of a thermally conductive material that thermally couples a coil of a superconducting magnet and a cryogenic cooling circuit, wherein a portion of the conductive coupler is disposed in a coupler passage of the support, and wherein the coupler passage provides a substantially direct path between the superconducting coil and the cryogenic cooling circuit.

14. The process of claim 13, wherein the step of limiting metal comprises the step of:
    aligning the coupler passage substantially along an axial direction of the support.

15. The process of claim 13, wherein the support comprises a plurality of layers, and wherein the step of limiting metal comprises locating the conductive coupler in one layer of the plurality of layers.

* * * * *